United States Patent
Gruber et al.

(10) Patent No.: US 9,212,648 B2
(45) Date of Patent: Dec. 15, 2015

(54) LASER SPARK PLUG

(75) Inventors: Friedrich Gruber, Hippach (AT); Markus Kraus, Wiesing (AT)

(73) Assignee: GE JENBACHER GMBH & CO OG, Jenbach (AT)

( * ) Notice: Subject to any disclaimer, the term of this patent is extended or adjusted under 35 U.S.C. 154(b) by 133 days.

(21) Appl. No.: 14/343,039

(22) PCT Filed: Sep. 5, 2012

(86) PCT No.: PCT/AT2012/050129
§ 371 (c)(1),
(2), (4) Date: Jun. 12, 2014

(87) PCT Pub. No.: WO2013/033746
PCT Pub. Date: Mar. 14, 2013

(65) Prior Publication Data
US 2014/0290613 A1 Oct. 2, 2014

(30) Foreign Application Priority Data
Sep. 6, 2011 (AT) .............................. A 1267/2011

(51) Int. Cl.
*F02B 19/00* (2006.01)
*F02P 23/04* (2006.01)
(Continued)

(52) U.S. Cl.
CPC . *F02P 23/04* (2013.01); *F01P 1/06* (2013.01); *H01S 3/025* (2013.01); *H01S 3/09415* (2013.01); *H01S 3/042* (2013.01); *H01S 3/0404* (2013.01); *H01S 3/0627* (2013.01); *H01S 5/02438* (2013.01); *H01S 5/183* (2013.01)

(58) Field of Classification Search
CPC .......... F02P 23/04; F02P 23/045; F02P 15/00
USPC .................. 123/143 B, 143 R; 313/149, 141; 250/503.1, 193.1
See application file for complete search history.

(56) References Cited

U.S. PATENT DOCUMENTS 5,845,480 A * 12/1998 DeFreitas ............... F02C 7/264
  123/536
6,514,069 B1  2/2003 Early et al.
(Continued)

FOREIGN PATENT DOCUMENTS

DE  10 2009 000 487 A1  8/2010
DE  10 2009 047 010 A1  5/2011
(Continued)

OTHER PUBLICATIONS

Gerhard Kroupa, Georg Franz, Ernst Winkelhofer "Novel miniaturized high-energy Nd-YAG laser for spark ignition in internal combustion engines"; Optical Engineering 48(1), 014202 (Jan. 2009).
(Continued)

*Primary Examiner* — Lindsay Low
*Assistant Examiner* — Long T Tran
(74) *Attorney, Agent, or Firm* — Workman Nydegger (57) ABSTRACT

A laser ignition plug, comprising a pumped light source and a longitudinally pumped laser resonator, which are each arranged in the housing of the laser ignition plug, characterized by a cooling air inlet, a cooling air outlet and a cooling region connecting the cooling air inlet with the cooling air outlet, wherein the cooling region is surrounding the pumped light source at least in certain sectors.

11 Claims, 5 Drawing Sheets

(51) Int. Cl.
  *F01P 1/06* (2006.01)
  *H01S 3/0941* (2006.01)
  *H01S 3/02* (2006.01)
  *H01S 3/06* (2006.01)
  *H01S 5/024* (2006.01)
  *H01S 5/183* (2006.01)
  *H01S 3/04* (2006.01)
  *H01S 3/042* (2006.01)

(56) References Cited

U.S. PATENT DOCUMENTS

| | | | | |
|---|---|---|---|---|
| 6,676,402 B1 * | 1/2004 | Early | | F02P 23/04 |
| | | | | 123/143 B |
| 7,549,404 B1 * | 6/2009 | Martin | | F02P 23/04 |
| | | | | 123/143 B |
| 7,806,094 B2 * | 10/2010 | Gruber | | F02M 57/06 |
| | | | | 123/143 B |
| 8,137,004 B2 * | 3/2012 | Berger | | G02B 6/3813 |
| | | | | 385/139 |
| 2006/0243238 A1 * | 11/2006 | Anezaki | | F02B 23/104 |
| | | | | 123/143 B |
| 2007/0064746 A1 * | 3/2007 | Winklhofer | | F02P 23/04 |
| | | | | 372/10 |
| 2009/0159031 A1 * | 6/2009 | Gruber | | F02M 57/06 |
| | | | | 123/143 B |
| 2010/0195679 A1 * | 8/2010 | Kroupa | | H01S 3/025 |
| | | | | 372/10 |
| 2011/0204265 A1 * | 8/2011 | Smith | | B82Y 10/00 |
| | | | | 250/503.1 |
| 2012/0024250 A1 * | 2/2012 | Weyl | | F02C 7/264 |
| | | | | 12/143 B |
| 2012/0132167 A1 * | 5/2012 | Weinrotter | | H01S 3/042 |
| | | | | 123/143 B |
| 2012/0180744 A1 | 7/2012 | Gruber et al. | | |
| 2013/0025549 A1 | 1/2013 | Weinrotter et al. | | |

FOREIGN PATENT DOCUMENTS

| | | |
|---|---|---|
| EP | 1 519 039 A1 | 3/2005 |
| EP | 2 072 803 A2 | 6/2009 |
| JP | 53 001734 | 1/1978 |
| JP | 2006 274940 A | 10/2006 |
| RU | 2215348 C2 | 10/2003 |
| WO | WO 2011/041805 A1 | 4/2011 |

OTHER PUBLICATIONS

PCT/AT/2012/05129, Apr. 2, 2013, International Search Report.

* cited by examiner

LASER SPARK PLUG

CROSS REFERENCE TO RELATED APPLICATIONS

This application is a U.S. Nationalization of PCT Application Number PCT/AT2012/050129, filed on Sep. 5, 2012, which claims priority to Austrian Patent Application No. A 1267/2011, filed on Sep. 6, 2011, the entireties of which are incorporated herein by reference.

The present invention relates to a laser ignition plug, comprising a pump light source and a longitudinally pumped laser resonator, which are each arranged in the housing of the laser ignition plug. The invention further relates to an internal combustion engine having a laser ignition plug, as well as an internal combustion engine adapted to such a laser ignition plug and, finally, a method for operating an internal combustion engine having a laser ignition plug.

For more than ten years projects and activities exist relating to the development of ignition devices for international combustion engines operated by Otto engines on the basis of laser technology. Due to several reasons, however, a series production readiness thereof has not been achieved. Technological progress in the last years, however, has prepared the path for series production readiness so that a serial use of the laser ignition may be expected within the next years.

With respect to electrical ignition systems, laser ignition devices have a number of advantages. The most important advantages are that laser ignition is in principle free of wear and that service life, hence, is independent of the operating conditions of the engine. This is in particular relevant for modern high-performance engines, in regard to which conventional electrical ignition systems reach their limits.

Laser ignition devices of the kind are essentially composed of a device for producing pump light, a laser, which emits a light pulse following the pumping process, as well as a focusing and coupling optics, by means of which the light pulse is converted into an ignition spark in the combustion chamber of the engine.

For a future series production readiness, in particular longitudinally pumped, passively Q-switched Nd:YAG laser crystals have shown to be most promising. According to the approach taken so far, these laser crystals are supplied by a pumped light source that is separate from the ignition plug and connected therewith via a light conductor. In this type of construction, there are not posed any high requirements regarding the cooling of the ignition plug in the area where the laser crystal is positioned, as heat release at the solid state laser is a rather low one.

For the semi-conductor laser generating the pump light (for each ignition plug), however, the temperature has to be kept constant at about 60° C. within a relatively narrow temperature range. This is only possible using a separate cooling device under consideration of the heat released by the laser diodes.

More recent developments have achieved huge progress in special semi-conductor lasers as pumped light source, the pumped light of which may be focused onto the laser crystal in a substantially easier way, which may be operated at higher operating temperatures and which are less prone to temperature fluctuations. These are based on the principle of "vertical-cavity surface-emitting laser" (VCSEL) technology. Using this technology, the pump light source may be integrated in the laser ignition plug in a cost-effective way. It is, however, necessary to cool the area of the housing of the laser ignition plug containing the pump light source and to keep this within determined limits on a defined temperature level (e.g., 60° C.±8° C.). In regard to the cooling of laser ignition plugs, the literature provides a number of proposals. For the most part, these are very complex devices or concepts having complex coolant circuits.

WO 2011/041805 A1 of the applicant discloses an internal combustion engine, wherein there is provided an ignition plug for the ignition of the fuel/air mixture in the combustion chamber of the internal combustion engine. The ignition plug is attached in the area of the cylinder head of the internal combustion engine by way of an ignition plug seat. The cylinder head has a cooling system, for which there is provided an individual cooling circuit, feeding water as a coolant for cooling activities. Also the ignition plug seat has a cooling system with its own cooling circuit. The WO 2011/041805 describes, apart from a spark ignition of the fuel/air mixture via electrical ignition plugs, also the "light ignition" by way of laser ignition plugs.

U.S. Pat. No. 6,514,069 describes that in laser ignition devices for internal combustion engines the temperature control of the laser ignition device constitutes a relevant aspect. In this connection, there is described the necessity of cooling the excitation laser and of the ignition laser. U.S. Pat. No. 6,514, 069 does not show any details in regard to cooling.

EP 1 519 039 A1 discloses a laser ignition plug having a Q-switched, pumped solid state laser. The solid state laser has a laser crystal embedded in the resonator, wherein a pumped light source supplies the resonator with pumped light. The solid state laser according to EP 1 519 039 A1 is a transversally pumped laser. In this document there is further described the necessity of optimal temperature control of the laser ignition plugs in internal combustion engines operated by an Otto engine, and there is furthermore indicated that cooling systems having, e.g., only one Peltier element are not sufficient. In order to solve this problem, EP 1 519 039 A1 proposes a cooling device, which is surrounding the laser crystal and the pump diodes of the laser ignition plug. This cooling device comprises three cooling elements: an external cooling circuit, which is coupled with the water cooling of the engine, an internal cooling circuit, which is also supplied with a liquid, and, finally, a Peltier cooling element.

The cooling systems for laser ignition plugs known from prior art are also rather complex—having several cooling circuits, Peltier elements, etc. Introducing cooling circuits with liquid cooling media further entrails the danger that the coolant will leak and damage components or endanger the operation of the internal combustion engine. The requirement of a cost-effective, efficient and practical cooling and temperature stabilization of the pumped light source in the laser ignition plug is not met by any known concept in a satisfactory way.

In contrast, it is the task of the present invention to provide a laser ignition plug that is simple, safe in operation and nevertheless cost-effective, in which these problems are mitigated.

This task is solved by a laser ignition plug, comprising a pump light source and a longitudinally pump laser resonator, which are both arranged in the housing of the laser ignition plug, characterized by a cooling air inlet, a cooling air outlet and a cooling region connecting the cooling air inlet with the cooling air outlet, wherein the cooling region is surrounding the pump light source at least in certain sectors.

In contrast to the prior art, the present solution suggests a laser ignition plug, which, on the basis of a heat exchange with conditioned cooling air, enables for a cooling and temperature stabilization of the device for generating the pumped and pulsed light in the laser ignition plug. The suggested solution is based on the surprising finding that the heat amount of about 8-15 watts for each laser ignition plug that is to be discharged by the laser ignition plug in the area of the pumped light generation may also be achieved by way of air cooling, although there have been used rather complex systems in the prior art so far. Simultaneously, in particular with the correspondingly conditioned cooling air, there is further guaranteed the required temperature constancy for the pump light source. Thus it was not an obvious finding that air may also guarantee the required uniform thermal conduction and the discharge of a sufficient amount of heat, in spite of the relative restricted spatial conditions for realising the cooling at the laser ignition plug. Furthermore, air need not be supplied in a circuit as it is the case with liquid coolants but it may rather exit at any position given on the internal combustion engine.

In a simple and preferred embodiment the cooling region is a cooling channel. Cooling channel is understood to be an essentially closed hollow space, which has a cooling air inlet and a cooling air outlet. In theory, there may also be provided several cooling air inlets and/or cooling air outlets, whilst ensuring that the amount of heat discharged is sufficient for an ideal operation of the laser ignition plug. This means that the heat exchange surface has to be correspondingly large.

In a preferred embodiment there is made provision for a compact configuration of the laser ignition plug that the cooling region extends at least in several sections in the housing of the laser ignition plug.

In a preferred embodiment there is provided that the cooling region is surrounding the pump light source at least in part in the form of a cylinder surface.

For an ideal heat discharge at the laser ignition plug there may be provided that the cooling region has a structure enlarging the surface in the area of the pump light source. This structure enlarging the surface simultaneously constitutes the heat exchange surface.

As structures enlarging the surface of the cooling region there are to be noted ribs, protrusions, bends and the like as examples. The boundary surface of the cooling region that adjoins the elements to be cooled, hence, is preferably provided with these structures enlarging the surface.

A further preferred embodiment example for enlarging the heat exchange surface would be the at least partly filling of the cooling region with a—preferably open-pored—foamed body. Such foamed bodies that are suitable as heat exchangers, which have a high mechanical and thermal stability, are therefore adapted to the predetermined material and geometry characteristics, this is, they have high thermal conductivity and an open-pored structure. In general, foamed bodies have a lower density than the pure material but still show high stiffness and strength. Examples of suitable foamed bodies include metal foams, ceramic foams, plastic foams and, naturally, combinations thereof.

Plastic foams, for example, may be produced by chemical foaming (e.g., by the propellant separating a gas in the polymerisation process) or by physical foaming (by introducing a propellant into the polymer in thermal processing). The plastic foams may also be, e.g., duroplasts or thermoplasts.

Metal foams are porous structures of metallic materials, having pores and hollow spaces. Metal foams that are suitable as heat exchangers include, for example, aluminum, copper or special alloys.

In an analogous way, ceramic foams also have the mentioned characteristics, wherein in this case the foamed body is based on ceramic materials.

These foamed bodies are preferably joined with the boundary surfaces of the cooling region. This connection may be realized by way of joining means enabling for good heat transfer. As examples, there are to be mentioned soldered joints. The joining means is in this connection attached at the boundary surface, which is situated nearer to the pump light source to be cooled. The foamed body may alternatively or supplementarily be introduced also in an interlocking way in the cooling region.

In order to improve the heat transfer from the area of the pump light source, there may be provided in another embodiment that parts of the housing wall of the laser ignition plug in the area of the pump light source are composed of materials, which have higher thermal conductivity than the other regions. These heat conducting elements may be arranged in the area of the cooling channel and/or in the area of the pump light source.

The laser ignition plug according to the invention has preferably a longitudinally pumped resonator. There are further provided a device for generating a pumped light (pump light source), a passively Q-switched laser crystal, preferably a Nd:YAG laser crystal, which is optically pumped by the pumped light source, an input optics for focusing and introducing the laser pulse into the combustion chamber of the internal combustion engine, the housing of the laser ignition plug as well as electrical feed lines and control lines. Preferably, there is provided that the pumped light source has a vertical emitter or a vertical cavity emitting laser (VCSEL), respectively. The vertical cavity surface emitting laser (VCSEL) is a semi-conductor laser, in which the light is radiated off orthogonally to the plane of the semi-conductor chip, in contrast to common edge emitters, in which the light exits at one or two flanges of the chip.

A further task, which the inventors have posed to themselves, is the provision, apart from the laser ignition plug having the characteristics described above, of also an internal combustion engine, which may be operated using a laser ignition plug in an operation-safe and cost-effective way.

This task is solved by an arrangement, including an internal combustion engine that may be operated by an Otto engine and a laser ignition plug—in particular of the type mentioned above—having a pumped light source arranged in the laser ignition plug, wherein the laser ignition plug is releasably attached in the cylinder head of the internal combustion engine, wherein the laser ignition plug has a cooling air inlet, a cooling air outlet and a cooling region connecting the cooling air inlet with the cooling air outlet, wherein the cooling region is surrounding the pump light source at least in some sections, wherein the cooling air inlet of the laser ignition plug is connected with a cooling air feeding device.

As already mentioned above, the suggested proposal is based on the surprising finding that the amount of heat to be discharged by the laser ignition plug in the area of the pump light generation of about 8-15 watts per laser ignition plug may also be realised using air cooling, wherein increasing the pressure of the cooling air by about 0.1 to 0.3 bars is sufficient. For this reason, there may also be provided a simple cooling air feeding device such as a pump, blowers or optionally a compression device.

Contrary to known systems, in which there is provided a coolant circuit, a circuit system may be omitted in the case of air cooling. An advantageous embodiment variant thus provides that the cooling air outlet of the laser ignition plug is open in the flow direction, this is, not connected with the cooling air connection (downstream in the flow direction) according to the type of the coolant circuit.

For an optimal laser performance and, hence, also for an optimal operation the internal combustion engine the temperature fluctuations at the pumped light source should be rather low. In particular with outdoor temperature fluctuations it is thus advantageous if there is made provision of a temperature controlling device between the cooling air feeding device and the cooling region.

The subject internal combustion engines are operated by charging devices, wherein the compressed combustion air or the compressed mixture, respectively, are down-cooled in a charge air cooler (intercooler) to a temperature of 50 to 80° C. In those cases, in which downcooling to about 50° C. is carried out, the cooling circuit for the charge air cooler may be used to control the temperature of the cooling air for the laser ignition plugs, thus guaranteeing a very constant temperature. Hence, in an aspect of the invention there may be optionally provided that there is made provision of a charge air cooler for the charge air of the internal combustion engine, wherein the temperature controlling device is connected with the charge air cooler via the cooling medium of the charge air cooler.

In an advantageous embodiment there is provided that there is made provision of several laser ignition plugs, wherein there is provided a common cooling air feeding device for at least two laser ignition plugs.

In a further aspect the invention relates to an internal combustion engine that may be operated by an Otto engine, comprising a seat region for a laser ignition plug, wherein there is provided a cooling air feeding device, which is releasably connected with a cooling air connection of the laser ignition plug via an adaptor, so that cooling air is directed from the cooling air feeding device to the cooling air connection.

Thereby, there may be made the provision that the adaptor has an essentially ring-like channel.

By way of the figures and the figure description there are explained exemplary embodiments, embodiment variants, further details and advantages of the invention.

Figure 1:
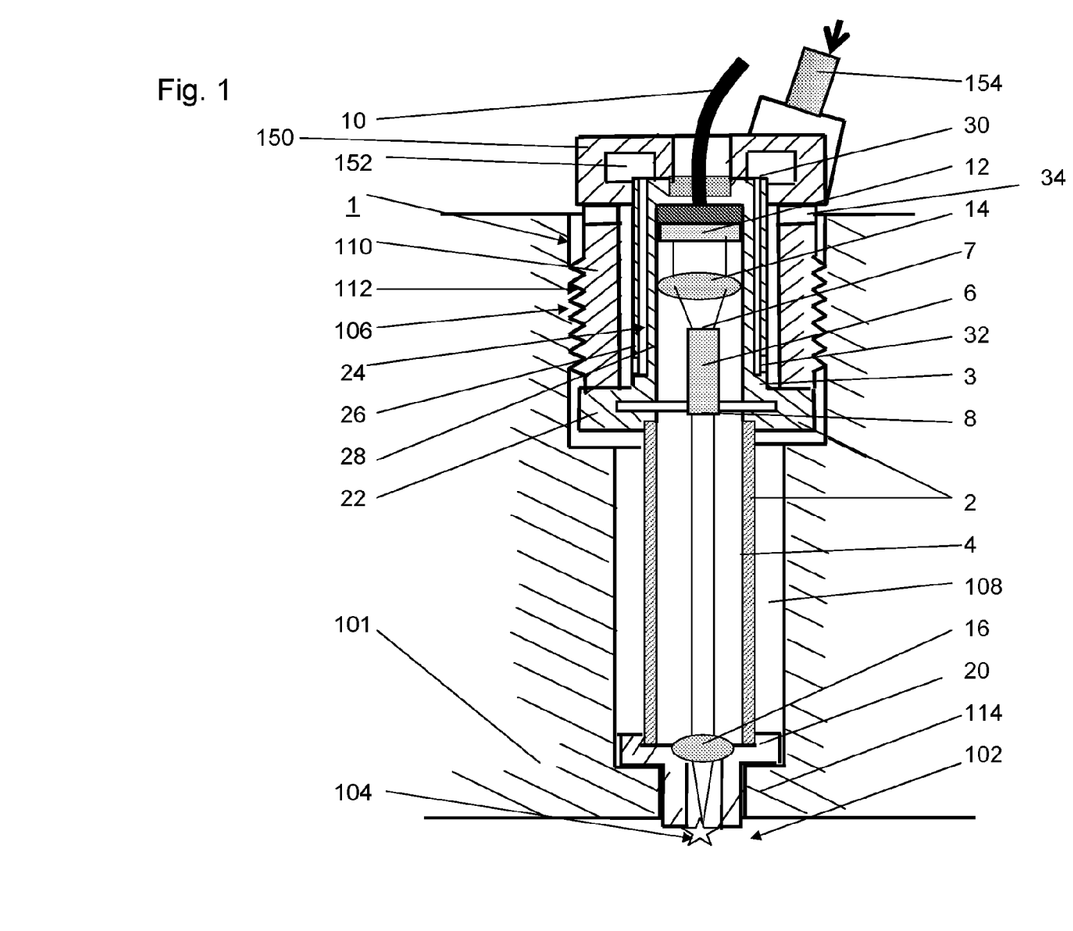
FIGS. 1 to 4 show exemplary embodiments for laser ignition plugs according to the invention.

In FIG. 1 there is schematically depicted an exemplary embodiment of a laser ignition plug 1 according to the invention. The laser ignition plug 1 is releasably attached in the also only schematically depicted cylinder head 101 of an internal combustion engine 100 via a screw connection. For this reason, the laser ignition plug 1 is introduced in a seat region in the cylinder head 101 into the ignition plug channel 108. In the ignition plug channel 108 there is situated a threaded section 106 having a corresponding counter-threading 112 on a biasing sleeve 110. The biasing sleeve 110 biases the housing 2 of the laser ignition plug in the cylinder head 101 by the biasing sleeve 110 pressing the support flange 22 into the direction of the combustion chamber 102. The laser ignition plug 1 is supported via the support flange 20 for the cylinder head on a protrusion 114 in the cylinder head 101 and is thus biased by turning the threads 106, 112.

The housing 2 of the laser ignition plug 1 is divided into an upper ignition plug section 3, at which there are situated the connections and which faces away from the combustion chamber 102, and into a lower ignition plug section 4, which faces the combustion chamber.

Inside the housing 2 of the laser ignition plug 1 there is situated the actual ignition laser, which is composed of a laser resonator 6 having an input mirror 7, an output mirror 8 and the laser crystal situated inbetween, and the pump light source 12. The pump light source 12 is supplied with energy by the current source via a current feed line 10. The pump light source consists of a VCSEL semi-conductor laser, the light emission of which is depicted as pump light via a focusing lens onto the entry facette of the pulsed solid-body laser. In the pulsed solid-body laser there is generated the laser pulse, which generates the ignition spark via the input optics 16 in the ignition point 104 in the combustion chamber 102. The input optics 16 usually comprises (one) focusing lens(es) and a combustion chamber window, which seals the combustion chamber 102 from the inside of the laser ignition plug 1.

The laser ignition plug 1 has a cooling air inlet 30, into which the cooling air enters. The cooling air inlet 30 is situated at the upper end of the laser ignition plug 1, and it is connected with the cooling air feeding line 154 via an adaptor 150. The cooling air inlet 30 is configured as a ring and extends at the upper end of the laser ignition plug 1. The cooling region 24 is embodied as a ring gap between the external cooling channel wall 26 and the internal cooling channel wall 28, thus forming a cooling channel 24. This cooling channel 24 has more or less the form of a cylinder sleeve having a circular cross-section. At the upper end of the cooling channel 24 there is provided a cooling air outlet 32, through which the cooling air may exit. The heated cooling air then exits via the ring gap 34. The cooling air, hence, need not be directed in a circuit, as it is the case with liquid cooling media, but it may rather again exit at any position given at the internal combustion engine 100.

The adaptor 150 has a ring-like channel, and it is put onto the laser ignition plug 1 in a force-fitting and/or form-fitting way. For this reason, there may be provided at the laser ignition plug 1 and/or at the adaptor 150 corresponding attachment elements.

In the exemplary embodiment of FIG. 1, the cooling region 24 is embodied without the structures 18 enlarging the surface. In contrast thereto, there is shown in the exemplary embodiment of FIG. 2, which only shows the upper section of the laser ignition plug 1, a structure 18 enlarging the surface, and actually in the form of a foamed body 18. This is introduced in the ring-like cooling channel 24 and soldered to preferably one or more positions at the boundary surface at the side of the pumped laser to the cooling channel 24 for a good contact (and thus associated good heat transfer). The remaining parts of the laser ignition plug 1 of the FIG. 2 are correspondent with the parts of the laser ignition plug 1 of the FIG. 1 so that a detailed explanation is omitted and so that there is made reference to the explanations in regard to FIG. 1.

The cooling air flows through this foamed body 18 from the top downwards, exits the foamed body 18 at the underside and flows along the outer side of the foamed body 18 again upwards, exiting the cooling system and thus also the internal combustion engine 100.

The suggested solution preferably envisages that there is realised common cooling air processing and feeding for all laser ignition plugs of the internal combustion engine 100 as well as a special type of heat exchange between laser ignition plug 1 and cooling air.

Figure 2:
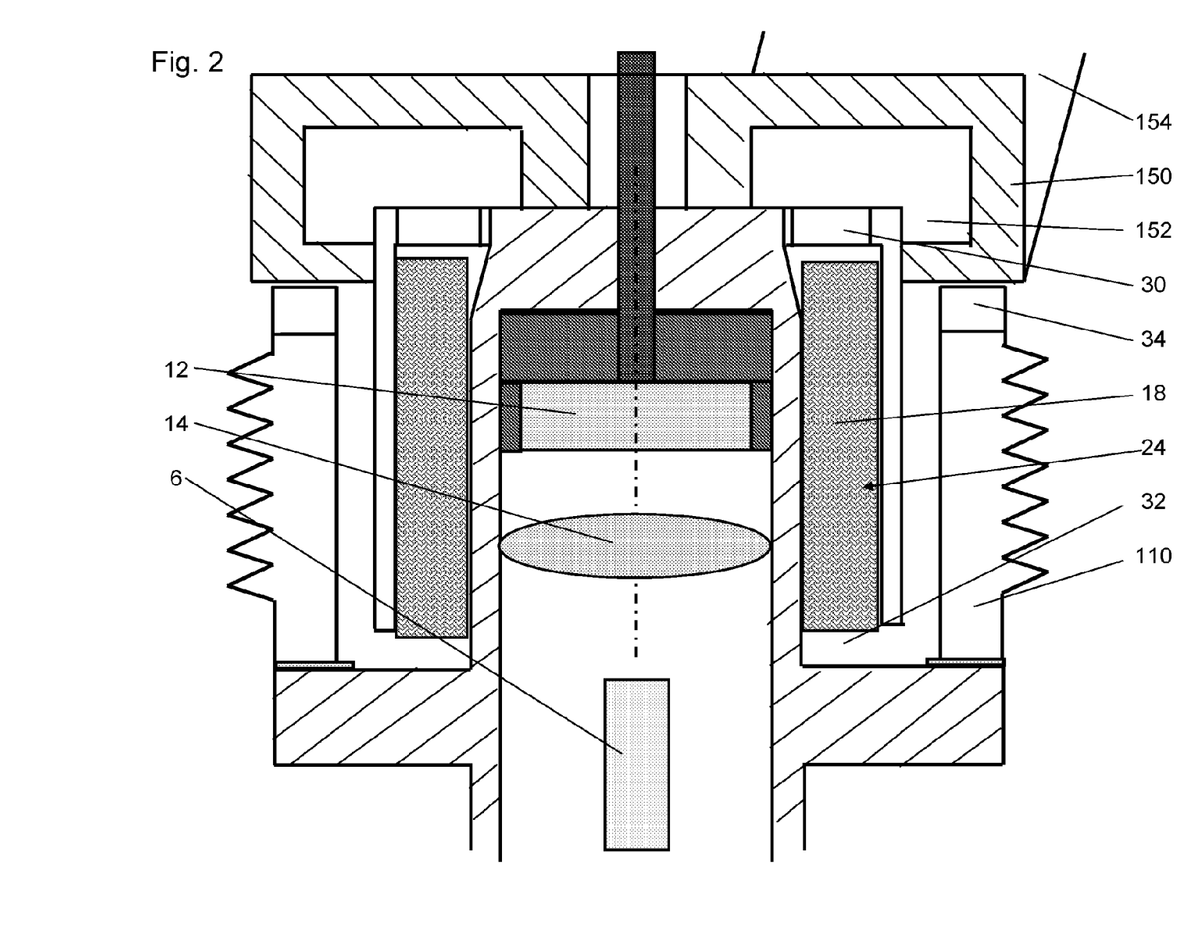
Figures 3, 4:
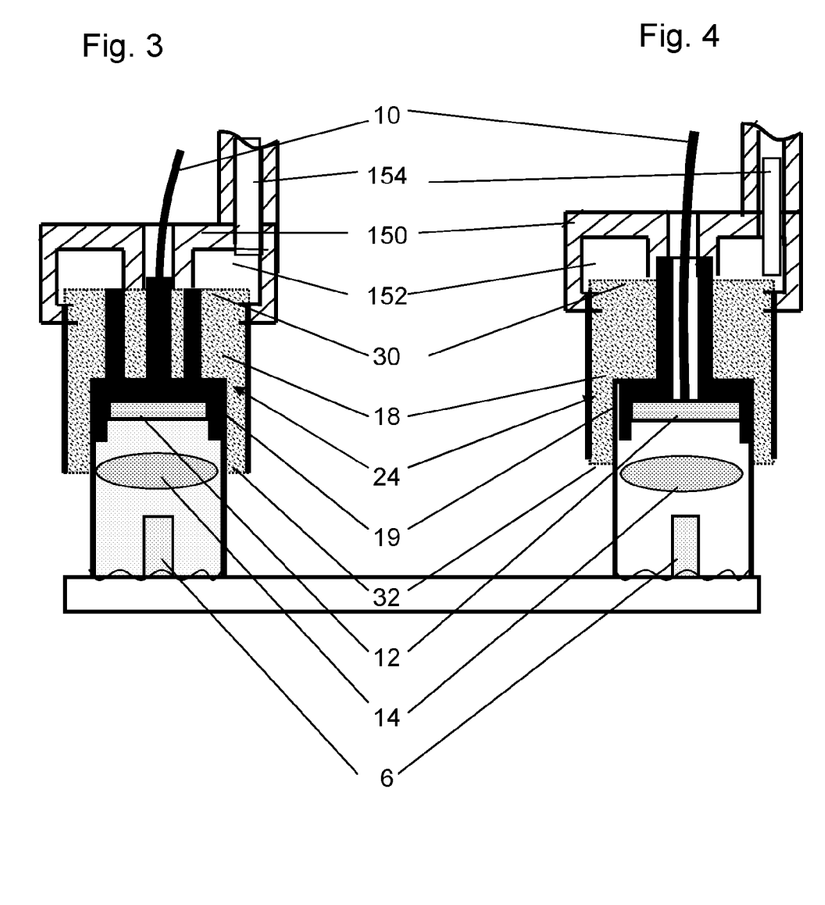

The exemplary embodiments of the FIGS. 3 and 4 show minimum constructional changes in comparison with the embodiment examples of the FIGS. 1 and 2. Also herein, the same components have the same reference symbols, so that a detailed description of all components may be omitted and so that there is made reference to the explanations of the FIGS. 1 and 2. The most important difference in regard to the previous examples is the cooling region 24 that is embodied in a different way, in both embodiment variants of the FIGS. 3 and 4 being configured broader in the upper area and narrower in the lower area. In both embodiment variants, structures 18 enlarging the surface such as metal, ceramic or plastic foams are introduced. In addition, the two examples of the FIGS. 3 and 4 show further heat conduction elements 19 in the form of metallic inserts, e.g., made of copper. These, additionally, will increase heat discharge.

Figure 5:
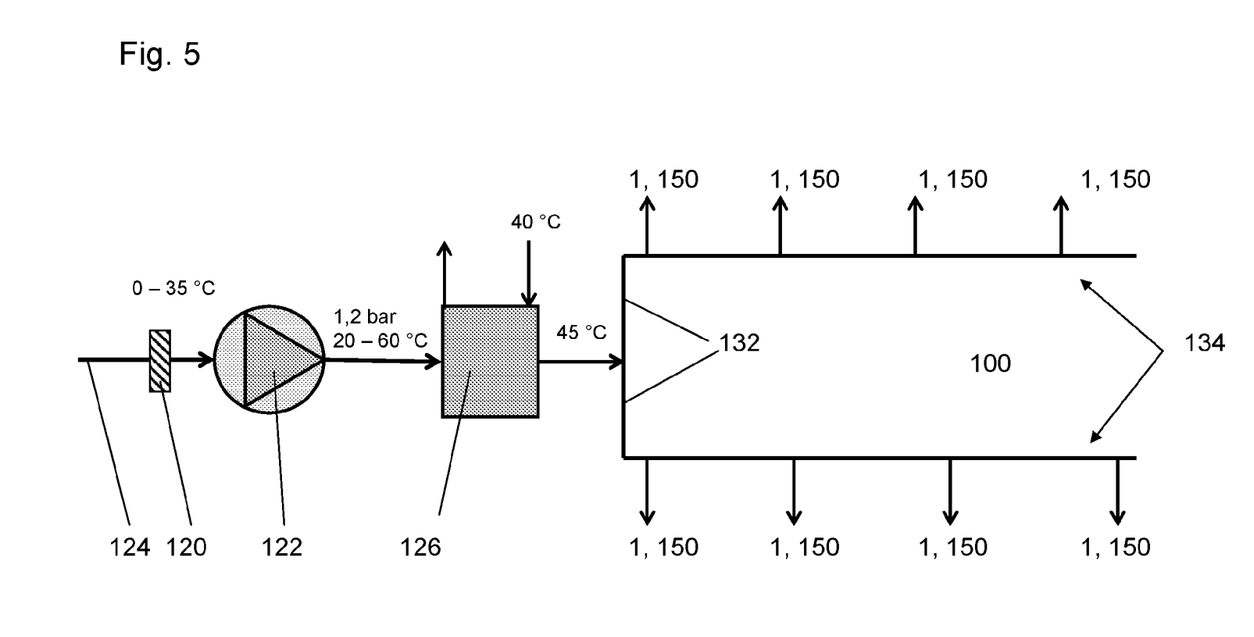
FIGS. 5 and 6 show arrangements according to the invention.
Figure 6:
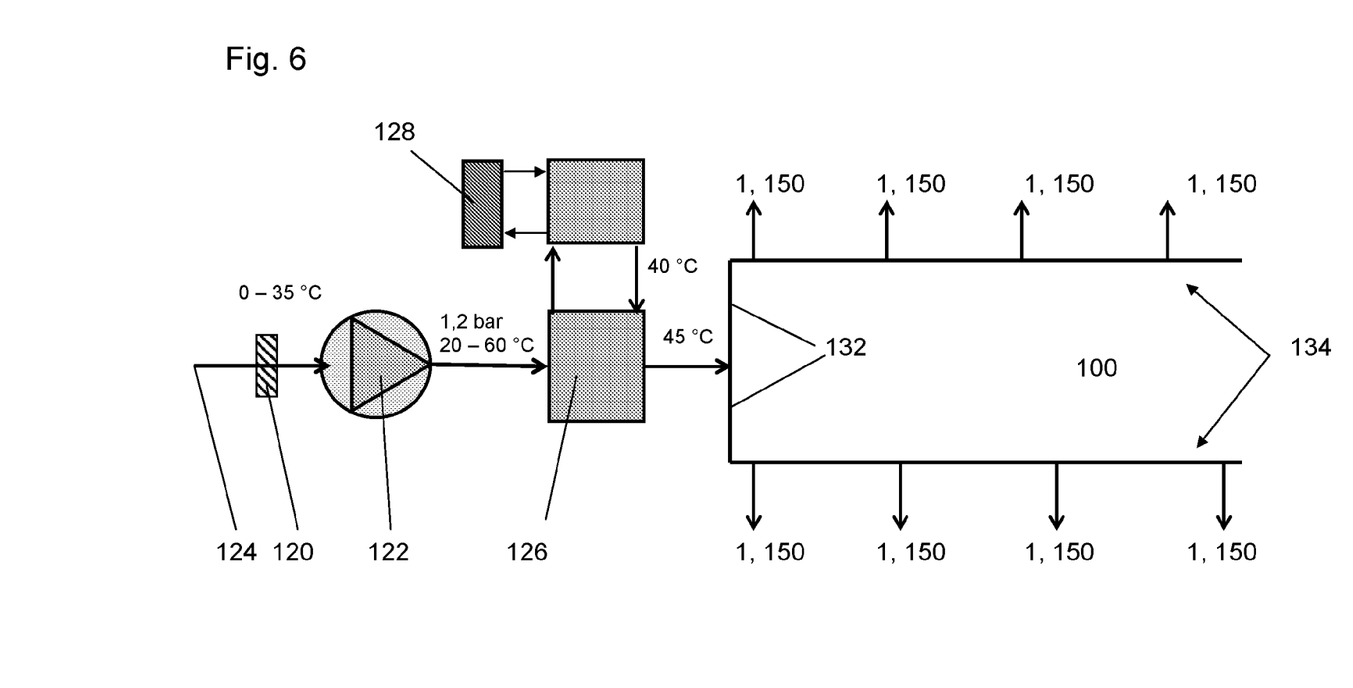

FIGS. 5 and 6 show two exemplary embodiments for inventive arrangements for the cooling system of the laser ignition plugs 1 of internal combustion engines 100 having laser ignition plugs 1. The laser ignition plugs 1 and also the respective internal combustion engine 100 are only schematically depicted. Air is sucked in via an air filter 120 through an air feed and fed to a cooling air feeding device 122 in the form of a blower. The air, however, may also be removed from the charge air of the internal combustion engine following the air filter and be fed to the cooling air feeding device 122. The pressure of the cooling air is increased in the cooling air feeding device 122 by about 0.1 to 0.3 bars. In this way, the temperature of the cooling air is increased by about 20° C. to, e.g., 20° C. to 60° C., depending on the ambient temperature. Subsequently, the air flows through a temperature controlling device 126 in order to adjust the air to a certain desired temperature. The temperature controlling device 126 may be a heat exchanger, the cooling medium of which having a temperature of, e.g., about 40° C. The cooling air having this temperature is then directed via a distribution line 132 to the laser ignition plugs 1, where the heat exchange is realised. The distribution line 132 herein forms two main branches for the cylinder banks 134 each having four cylinders 136. Internal combustion engines 100, to which the inventive proposal refers, are frequently operated in a stationary way using a generator in order generate electric power. These then usually have significantly more than 8 cylinders, e.g., up to 24 cylinders.

In the exemplary embodiment of the FIG. 6 there is, in contrast to the exemplary embodiment of the FIG. 5 regarding the first temperature controlling device 126, provided an additional temperature controlling device 128, which adjusts the working medium for the temperature controlling device 126 to a defined temperature. This may, for example, be a controlled or regulated cooling aggregate 128.

Thermal conduction in the metal foam heat exchanger is very intensive due to the large specific surface and the microscale turbulence of the flow, so that the temperature at the ignition plug housing may be maintained relatively close to the temperature of the cooling air.

Detailed calculations have shown that a layer thickness (or wall thickness, respectively) of the foamed body 24, if this is present in the form of a hollow cylinder having a thickness of about 5-7 mm and a height (or length, respectively) of 20-40 mm, is sufficient in order to discharge the heat generated in the laser ignition plug 1 at the pumped light source 12 at a cooling air temperature of about 43° C. in a way so that the surface temperature of the ignition plug housing 2 does not exceed about 60° C. at the upper end of the laser ignition plug 1. The air mass flow in this model is about 2.8 m³/h, and the leading flow velocity at the front surface of the hollow metal foam cylinder is about 1.5-2 m/s. Upon entering the metal foam the positive pressure of the air is about 0.1-0.3 bars.

Further details or variants, respectively, of the invention are as follows:
  The temperature controlling device, which comprises a coolant circuit with cooling water, may correspond with, e.g., the low temperature cooling circuit of the charge air cooling of the engine.
  The suggested solution provides preferably for a construction of the laser ignition plug, which has a large length in comparison with the diameter and the attachment device of which is situated in the upper half of the ignition plug.

| Reference list: | |
|---|---|
| 1 | laser ignition plug |
| 2 | housing of the laser ignition plug |
| 3 | upper ignition plug section |
| 4 | lower ignition plug section |
| 6 | laser resonator |
| 7 | input mirror |
| 8 | output mirror |
| 10 | electrical feed line |
| 12 | pump light source |
| 14 | focussing lens |
| 16 | input optics |
| 18 | structure enlarging the surface |
| 19 | heat conducting elements |
| 20 | support flange for cylinder head |
| 22 | support flange for biasing sleeve |
| 24 | cooling channel |
| 26 | external cooling channel wall |
| 28 | internal cooling channel wall |
| 30 | cooling air inlet |
| 32 | cooling air outlet |
| 34 | ring gap |
| 100 | internal combustion engine |
| 101 | cylinder head |
| 102 | combustion chamber |
| 104 | ignition point |
| 106 | threaded section in the cylinder head |
| 108 | ignition plug shaft/seat region |
| 110 | biasing sleeve |
| 112 | threaded section on biasing sleeve |
| 114 | protrusion in the cylinder head |
| 120 | air filter |
| 122 | cooling air feeding device |
| 124 | air feed |
| 126 | temperature controlling device |
| 128 | second temperature controlling device |
| 132 | distribution line |
| 134 | cylinder bank |
| 150 | adaptor |
| 152 | cooling channel in the adaptor |
| 154 | feed line |

The invention claimed is:
1. A laser ignition plug, comprising a housing,
  a pump light source,
  a longitudinally pumped laser resonator,
  said pump light source and said longitundally pumped laser being arranged in said housing,
  wherein the laser ignition plug further comprises
  a cooling air inlet,
  a cooling air outlet and
  a cooling region connecting said cooling air inlet with said cooling air outlet,
  wherein the cooling region is surrounding said pump light source at least in certain sectors, the cooling region is configured as a cooling channel, the cooling region has a structure enlarging the surface in the area of the pumped light source, and the structure enlarging the surface comprises a foamed body.

2. The laser ignition plug according to claim 1, wherein said foamed body is porous with open porosity.

3. The laser ignition plug according to claim 1, wherein the foamed body comprises a metallic foamed body, a ceramic foamed body, a plastic foamed body or a combination thereof.

4. The laser ignition plug according to claim 1, wherein elements are provided with higher thermal conductivity at least at one of the areas of
  the housing of the laser ignition plug,
  the lining of the cooling region, or
  the area adjoining the pumped light source.

5. The laser ignition plug according to claim 1, wherein the pump light source has a VCSEL.

6. An arrangement, comprising
an internal combustion engine,
a laser ignition plug, having a pumped light source arranged in the laser ignition plug,
wherein the laser ignition plug is releasably attached in the cylinder header of the internal combustion engine,
wherein the laser ignition plug has a cooling air inlet, a cooling air outlet and a cooling region connecting the cooling air inlet with the cooling air outlet,
wherein the cooling region is surrounding the pump light source at least in certain sectors and wherein the cooling air inlet of the laser ignition plug is connected with a compression device.

7. The arrangement according to claim 6, wherein cooling air outlet of the laser ignition plug is open in the flow direction.

8. The arrangement according to claim 6, wherein the compression device is arranged downstream of a temperature controlling device.

9. The arrangement according to claim 6, wherein there is provided a charge air cooler for the charge air of the internal combustion engine, wherein the temperature controlling device is connected with the charge air cooler.

10. The arrangement according to claim 6, wherein there are provided several laser ignition plugs, wherein there is provided a common compressor device for at least two laser ignition plugs.

11. A method for operating an internal combustion engine, wherein a laser ignition plug, which has a pumped light source and a laser resonator pumped by the pumped light source, ignites a fuel/air mixture in a combustion chamber of the internal combustion engine, wherein the laser ignition plug is cooled using air, wherein air having a positive pressure of at least 0.1 bar is fed to each laser ignition plug.

* * * * *

UNITED STATES PATENT AND TRADEMARK OFFICE
CERTIFICATE OF CORRECTION

PATENT NO. : 9,212,648 B2
APPLICATION NO. : 14/343039
DATED : December 15, 2015
INVENTOR(S) : Gruber et al.

It is certified that error appears in the above-identified patent and that said Letters Patent is hereby corrected as shown below:

In the Claims

In Column 8, Line 42, in Claim 1, delete "longitundally" and insert -- longitudinally --, therefor.

Signed and Sealed this
Twenty-sixth Day of July, 2016

Michelle K. Lee
*Director of the United States Patent and Trademark Office*